United States Patent [19]

Dennis et al.

[11] Patent Number: 5,008,301
[45] Date of Patent: Apr. 16, 1991

[54] ULTRAVIOLET CURING CONFORMAL COATING WITH DUAL SHADOW CURE

[75] Inventors: William E. Dennis; Bernard VanWert, both of Midland, Mich.

[73] Assignee: Dow Corning Corporation, Midland, Mich.

[21] Appl. No.: 313,407

[22] Filed: Feb. 21, 1989

[51] Int. Cl.$^5$ .................. G08G 77/06; C08G 77/20
[52] U.S. Cl. ........................... 522/13; 522/99; 528/17; 528/24; 528/32; 528/41; 528/21
[58] Field of Search ........................ 522/13, 99

[56] References Cited

U.S. PATENT DOCUMENTS

| 4,528,081 | 7/1985 | Lien et al. | 522/99 |
| 4,591,608 | 5/1986 | Okinoshima | 522/13 |
| 4,608,270 | 8/1986 | Varaprath | 522/99 |
| 4,824,875 | 4/1989 | Gutek | 522/9 |

FOREIGN PATENT DOCUMENTS

| 0040536 | 3/1977 | Japan . | |
| 2101150 | 1/1983 | United Kingdom | 522/99 |

OTHER PUBLICATIONS

Copending U.S. application, Ser. No. 07/200,827, Filed Jun. 1, 1988.
Copending U.S. application, Ser. No. 07/118,086, Filed Nov. 6, 1987, now U.S. Pat. No. 4,824,875.

*Primary Examiner*—Marion E. McCamish
*Assistant Examiner*—Susan Berman
*Attorney, Agent, or Firm*—Roger H. Borrousch

[57] ABSTRACT

Compositions containing an acrylamide functional polydiorganosiloxane, a polydiorganosiloxane having methacryloxyalkyl functionality and silicon-bonded alkoxy functionality, a photoinitiator, and an organic titanate can be improved by using organic peroxides. The improvements are observed in shelf life and pot life of the uncurd composition, and the odor of the cured product. The resulting composition has ternary cure mechanisms with two of these mechanisms being available as shadow cure mechanisms, i.e. cures in areas not exposed to ultraviolet radiation by either exposure to atmospheric moisture or by heating.

32 Claims, No Drawings

ULTRAVIOLET CURING CONFORMAL COATING WITH DUAL SHADOW CURE

BACKGROUND

1. Field of the Invention

This invention relates to a coating composition which can cure by exposure to ultraviolet radiation, has capabilities of curing by exposure to moisture at room temperature, and has capabilities of curing by the application of heat. The ability to cure at room temperature or at elevated temperature provides the coating composition with a characteristic which allows it to be used for coating applications where the possibility of exposing all the area of a coated substrate with ultraviolet radiation are so unlikely, so impractical, that one may say it is impossible. This cure process which cures without the exposure to ultraviolet radiation can be termed "shadow cure" or "dark cure" meaning cure which occurs without being exposed to the ultraviolet radiation, i.e. cures in the shadow of the exposure or in the dark areas when the ultraviolet radiation is directed on the substrate.

2. Background Information

Compositions which cure by exposure to ultraviolet radiation are well known in the art, although the number of such materials found in commercial usage today are still relatively small. An even smaller number of such compositions are known to the art which both cure by exposure to ultraviolet radiation and also by another mechanism, such as by heat. Compositions which cure by two mechanisms are said to have dual cure.

Compositions which cure by exposure to ultraviolet radiation and by exposure to moisture, i.e. a dual cure, are also known in the art as shown by Lien et al in U.S. Pat. No. 4,528,081, issued Jul. 9, 1985. Lien et al describe a dual curing silicone composition which contains an acrylic functional dialkoxy or diaryloxy silyl group terminated polyorganosiloxane, an effective amount of a photosensitizer, and a silicone moisture curing catalyst. These compositions of Lien et al can also contain trimethylsilyl terminated silicone oil. Lien et al describe their materials as curing to soft gel like materials or soft rubbery materials. In their examples, the cured materials are defined as a soft rubbery material at 0% oil to a very soft sticky gel at 70% oil which showed a tendency to creep but would not flow.

Polyorganosiloxane compositions which have a dual cure mechanism, namely cure by exposure to ultraviolet radiation and by exposure to moisture at room temperature, are claimed in a copending application Ser. No. 07/200,827, filed Jun. 1, 1988, for Beth I. Gutek, entitled "COMPOSITIONS HAVING UV CURE WITH MOISTURE SHADOW CURE" and assigned to the same assignee as this application, which is hereby incorporated by reference to show the compositions which can be modified to make the present invention. Gutek in that application describes a composition comprising an acrylamide polyorganosiloxane, a polydiorganosiloxane having endgroups with two alkoxy groups to a silicon atom and a methacrylate group bonded to a silicon atom through an Si—C bond, a photoinitiator, and organic titanate. These compositions are best cured in an inert atmosphere during exposure to ultraviolet radiation.

Gutek also describes compositions which have a dual cure, namely cure by ultraviolet radiation and at room temperature by exposure to moisture, in copending application Ser. No. 07/118,086, filed Nov. 6, 1987, entitled "UV CURABLE CONFORMAL COATING WITH MOISTURE SHADOW CURE" and assigned to the same assignee as this application and is hereby incorporated by reference to show compositions which comprise acrylamide polyorganosiloxane, polydiorganosiloxane having alkoxy and methacrylate as described above, a reactive diluent selected from isobornyl acrylate, cyclohexyl acrylate, or 2-ethylhexyl acrylate, a combination photoinitiator which is a mixture of 2-hydroxy-2-methylphenylpropanone and 2-methyl-1-[4-(methylthio)phenyl]-2-morpholenopropanone, an amine selected from dimethylethanolamine or diisopropylethylamine, and an organic titanate. These compositions cure so fast in an inert atmosphere that it is necessary to cure them in the presence of air (oxygen). These compositions of Gutek can be modified to give the compositions of the present invention.

The compositions described in either of the Gutek copending application are very useful materials which can be used to coat printed wire boards as conformal coatings, but both have disadvantages, namely that the shelf life is not as long as needed to ship the materials to the coaters from the manufacturers plants and during the cure of these compositions the odor of the reactive diluent was very unpleasant and thus objectionable to the coaters. Investigations to resolve these problems lead to the unexpected discover of the compositions of the present invention.

SUMMARY OF THE INVENTION

The present invention is a composition which has ternary cure mechanisms, i.e. it cures by exposure to ultraviolet radiation, cures by exposure to moisture at room temperature, and cures by exposure to elevated temperatures.

This invention relates to an ultraviolet radiation curable composition comprising a mixture of an acrylamide functional polydiorganosiloxane, a methacryloxyalkyl functional and alkoxy functional polydiorganosiloxane, a photoinitiator, and an organic titanate wherein the storage stability is increase by the addition of an organic peroxide in a sufficient quantity to also provide cure activated by heat in areas shadowed from ultraviolet radiation.

DESCRIPTION OF THE PREFERRED EMBODIMENTS

The compositions of the present invention can be cured by three different mechanisms, namely exposure to ultraviolet radiation, by exposure to moisture at room temperature, and by exposure to elevated temperature sufficient to activate the organic peroxide. The compositions of this invention have improved shelf life and pot life compared to compositions without the organic peroxide. It was completely unexpected that by adding an organic peroxide which decomposes to give free radicals would extend the shelf life and the pot life and produce cured films which provide tack free films under a greater number of conditions than comparable compositions without the organic peroxide. Another advantage is that the cured compositions have much less odor. The odor associated with the reactive diluent, such as isobornyl acrylate, is significantly reduced when the compositions of the present invention are used, as compared to similar compositions without the organic peroxide.

The acrylamide functional polydiorganosiloxane along with the methacryloxyalkyl functional and alkoxy functional polydiorganosiloxane provide the polymer base for the compositions of the present invention and preferably comprise 45 to 98 weight percent of the total weight of the composition.

The acrylamide polydiorganosiloxane (A) contains at least 20 siloxane units and, as many as, 1500 siloxane units. These siloxane units contain at least two acrylamide functional groups which are bonded to silicon atoms through Si—C bonds. The acrylamide functional groups can be either on the terminal silicon atoms of the polymer chain or they can be pendent on silicon atoms along the polymer chain. The remaining organic groups bonded to the silicon atoms of the polyorganosiloxane are methyl or phenyl, where the methyl are preferred for economical reasons, the combinations of methyl and phenyl can be useful for providing compatible compositions with reactive diluents and photoinitiators. The acrylamide functional polydiorganosiloxanes are known in the art from Varaprath in U.S. Pat. No. 4,608,270, issued Aug. 26, 1986, and is hereby incorporated by reference to show the polydiorganosiloxanes with acrylamide functionality and to show the methods of making such polymers. The polydiorganosiloxanes which are useful in the present invention are those which have from 20 to 1500 siloxane units and at least two acrylamide groups. The siloxane units can include dimethylsiloxane units, diphenylsiloxane units, methylphenylsiloxane units, trimethylsiloxy units, dimethylphenylsiloxy units, and siloxane units of the formula

in which Z is H or R, R is a monovalent hydrocarbon radical, R' is methyl or phenyl, Q and Q' are divalent hydrocarbon radicals, A is an acyl radical having the formula

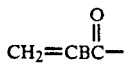

where B is H or $CH_3$, a is 1 or 2, and b is 0 or 1. The monovalent hydrocarbon radicals, R, can be alkyl radicals such as methyl, ethyl, propyl, butyl, hexyl, and octyl; cycloaliphatic radicals such as cyclohexyl; aryl radicals such as phenyl, benzyl, styryl, tolyl, and xenyl; and alkenyl radicals such as vinyl and allyl. Q and Q' are divalent hydrocarbon radicals such as ethylene, propylene, isopropylene, butylene, isobutylene, hexylene, octylene, and phenylene. Q is preferably ethylene and Q' is preferably propylene or isobutylene. When B is hydrogen, the acyl radical is acrylyl radical and when B is methyl, the acyl radical is methacrylyl radical. Polydimethylsiloxanes endblocked with

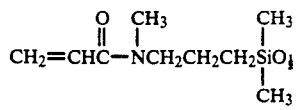

are preferred when the molecular weight is on the low end of the range, such as from 50 to 300 siloxane units, and when low viscosities are desired. The polydimethylsiloxanes which contain pendent or both pendent and terminal acrylamide functional groups are preferred when a higher crosslinked density is desired, such as to make tougher materials.

The compositions of the present invention also contain a polydiorganosiloxane which has a methacryloxyalkyl functionality and a silicon-bonded alkoxy functionality. This polydiorganosiloxane provides the composition the crosslinking means for the composition to cure by exposure to moisture at room temperature. This polydiorganosiloxane also contains the methacryloxyalkyl functionality which allows this polymer to react with other ingredients when exposed to ultraviolet radiation in the presence of photoinitiator. The methacryloxyalkyl functional and alkoxy functional polydiorganosiloxane, (B), can be one polymer or a combination of two or more polymers.

The polydiorganosiloxane (B) contains dimethylsiloxane units, diphenylsiloxane units, and methylphenylsiloxane units to provide on the average less than 350 siloxane units, preferably less than 100 siloxane units. The polydiorganosiloxane (B) is preferably endblocked with (gamma-methyacryloxyalkyl)dimethoxysiloxy units where the alkyl is preferably propylene or isobutylene. These polydiorganosiloxanes of (B) can be prepared, for example, by mixing hydroxyl endblocked polydiorganosiloxane, a silane such as gamma-methyacryloxypropyltrimethoxysilane or gamma-methyacryloxyisobutyltrimethoxysilane, in the presence of a catalytic amount of alcoholic potassium hydroxide. It is recommended that polymerization inhibitor be used during this process and can include such compounds as phenothiazine and para-methoxyphenol. A slight excess of the theoretical amount of silane is recommended to ensure complete reaction, such as 10 weight percent excess. The ingredients are mixed and heated to remove the stoichiometric amount of methanol (in this illustrated method). After the stoichiometric amount of alcohol is removed, the resulting mixture is neutralized with acetic acid. The polydiorganosiloxanes of (B) have a general formula

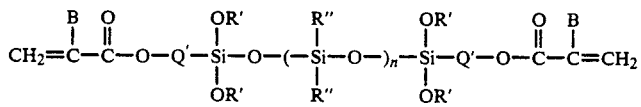

where B is H or methyl, Q' is a divalent alkylene radical such as propylene or isobutylene, R' is an alkyl radical such as methyl, ethyl or propyl, each R" is methyl or phenyl, and n is an average value of less than 350. The resulting polydiorgano-siloxane (B) made from the process defined herein may contain some unreacted silane because an excess is used. Because such an excess is usually in the range of less than 20 weight percent, the compositions of this invention can include the excess silane, such as from 5 to 15 weight percent based on the weight of the product of the process. The presence of excess silane also provides increased shelf stability for the uncured composition and is particularly advantageous for extended pot life when the uncured composition comes into contact with atmospheric moisture such as during coating operations, such as where printed wire boards are dip coated.

The photoinitiator (C) is one which is compatible with a combination of (A) and (B) and which will function in the presence of organic titanate. Photoinitiators which are useful in these compositions include

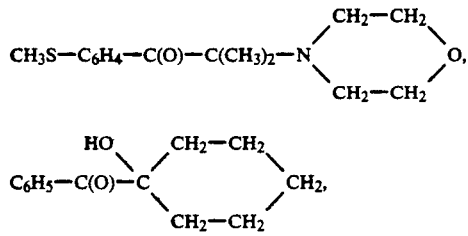

and benzoin methyl ether.

The organic titanate catalyst of (D) provides the moisture curability for the composition and can be any of the conventional organic titanates such as tetraisopropyl titanate, tetrabutyl titanate, bis(acetylacetonate)-diisopropyl titanate, and bis(ethoxyacetylacetonate)-diisopropyl titanate. The amount of the organic titanate should be sufficient enough to catalyze the composition when exposed to atmospheric moisture after having been exposed to ultraviolet radiation. Thus, any organic titanate which undergoes some reaction from ultraviolet radiation may not be suitable if it looses its ability to cause the curing reaction in the shadowed areas. Also the amount of organic titanate should not be so great as to influence the ultraviolet radiation curing mechanism. A preferred range of organic titanate is from 0.05 to 1 weight percent based on the total weight of the composition. A preferred organic titanate is tetrabutyl titanate.

The compositions of this invention can contain a reactive diluent, (F), to reduce the viscosity of the composition and to provide tougher cured films and coatings. The reactive diluent, (F), must be compatible with the rest of the ingredients of the composition and react during the curing processes so that they become part of the cured product. Reactive diluents, (F), which were found to be especially useful for these compositions include isobornyl acrylate, cyclohexyl acrylate, and 2-ethylhexyl acrylate. The compositions can also contain small amounts of multifunctional acrylates, such as up to 10 weight percent based on the weight of the composition. Some multifunctional acrylates can be illustrated by pentaerythritol diacrylate, pentaerythritol triacrylate, pentaerythritol tetraacrylate, and mixtures thereof.

The ingredient which provides the compositions of the present invention with the property of improved shelf life is an organic peroxide which can be activated by heat at temperatures which will not harm the substrates on which it is coated within the time period necessary to cure the composition in shadowed areas. These organic peroxides increase the storage stability (shelf life) of the composition. By the term "storage stability" it is meant that the composition can be packaged in a container which excludes exposure to ultraviolet radiation and maintain its viscosity, coating properties, and cure properties over the storage period between the time it is manufactured and the time it is used, such as in coating a printed circuit board. The amount of organic peroxide should be enough to cure the composition in the shadowed areas by the application of heat but not enough to harm the substrate. A particularly useful organic peroxide is 1,1-bis-tertiary-butyl-peroxy cyclohexane.

The compositions of the present invention have two photocurable polymers, i.e., the acrylamide functional polyorganosiloxane and the methacryloxy functional polydiorganosiloxane. This two polymer combination cures faster when exposed to ultraviolet radiation than compositions containing only the methacryloxy functional polydiorganosiloxanes. The methacryloxy functional polydiorganosiloxane is required because it provides the groups which have the ability to moisture cure. The compositions of the present invention also cure to clear materials. This characteristic is observed when materials, which would otherwise be incompatible when reacted, coreact. If the two functional polymers did not coreact, the cured products would result in hazy or opaque materials, if they cured at all.

The compositions of the present invention have a combination of being useful materials which are solventless, can be low in viscosity and cure to flexible materials which can exhibit cold temperature flexibility. Being solventless and low in viscosity is a desirable combination for coatings such as would be useful as conformal coatings for printed circuit boards, especially where more than one cure mechanism is needed, UV, heat, and moisture, and where the resulting cured films and coatings need low temperature flexibility.

The compositions of the present invention particularly useful as conformal coatings for printed circuit boards or printed wire boards, depending on the terminology one desires to use. For the purposes for the present invention these terms are interchangeable. Compositions which are especially useful coatings for these boards have low viscosities, so that the boards can be dip coated or spray coated, and cure to an acceptable tough coating. These compositions have a viscosity at 25° C. in the range of 0.07 to 0.2 Pa.s and comprise at least 20 weight percent of (A), polydimethylsiloxane having acrylamide functional groups at the polymer ends; at least 20 weight percent of (B) polydiorganosiloxane having endgroups containing both alkoxy groups and methacrylate groups where there are two alkoxy groups per endgroup bonded to silicon through an Si—O bond and one methacrylate group bonded to silicon through an Si—C bond and having less than 350 diorganosiloxane units per molecule, where said diorganosiloxane units are selected from the group consisting of dimethylsiloxane units, diphenylsiloxane units, and methylphenylsiloxane units wherein at least 50 percent of the organic groups of the diorganosiloxane units are methyl; at least 20 weight percent of a reactive diluent selected from the group consisting of isobornyl acrylate, cyclohexyl acrylate, and 2-ethylhexyl acrylate, 0.5 to 10 weight percent of a photoinitiator which is compatible with (A) and (B), and 0.05 to 1 weight percent of an organic titanate. The preferred compositions cure by exposure to a dose of ultraviolet radiation in the amount of as little as 200 millijoules per square centimeter (in an inert atmosphere such as nitrogen) and still moisture cure in the shadow areas or dark areas, i.e. where the composition is not exposed to the ultraviolet radiation. The compositions require high doses of ultraviolet radiation to cure in air, but readily cure under an inert atmosphere such as nitrogen. Other preferred compositions are those having polydimethylsiloxane (A) having on the average from 20 to 125 dimethylsiloxane units per molecule, polydiorganosiloxane of (B) being polydimethylsiloxane having on the average from 10 to 50 dimethylsiloxane units per molecule, and the reactive diluent is isobornyl acrylate.

Compositions of the present invention especially preferred as conformal coatings have uncured properties, curing characteristics, and cured properties which makes them particularly useful to coat printed circuit boards or printed wire boards. Such compositions comprise at least 20 weight percent based on the total weight of the composition of acrylamide polydimethylsiloxane, (A), having acrylamide end groups bonded to silicon atoms through Si—C bonds and on the average at least 20 to less than 300 dimethylsiloxane units per molecule, at least 20 weight percent based on the total weight of the composition of polydiorganosiloxane, (B), as described herein, at least 20 weight percent based on the total weight of the composition of a reactive diluent, (F), selected from the group consisting of isobornyl acrylate, cyclohexyl acrylate, and 2-ethylhexyl acrylate, from 0.5 to 10 weight percent based on the total weight of the composition of a photoinitiator, (C), combination in which there is at least 0.25 weight percent of

and at least 0.25 weight percent of

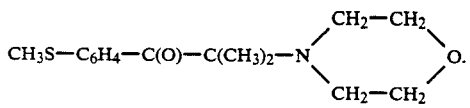

from 0.1 to 2 weight percent based on the total weight of the composition of an amine, (G), selected from the group consisting of dimethylethanolamine and diisopropylethylamine, and from 0.05 to 1 weight percent based on the total weight of the composition of an organic titanate, (D), where the composition has a viscosity at 25° C. in the range of 0.07 to 0.2 Pa.s.

These preferred conformal coating compositions of the present invention cure extremely fast and because they cure so fast, it is necessary to cure them in the presence of air (oxygen) to slow the rate of cure down. Conformal coatings which fast cure in an inert atmosphere, can cause the surface to distort, such as become wrinkled. The distortion causes an unattractive surface, but probably more importantly, it can also cause unacceptable stresses to be exerted on the components of a printed circuit board. Being able to develop compositions having a low viscosity, having the ability to cure by UV radiation, moisture, and heat to films which have low temperature flexibility, and have fast cure in air and have extended storage stability was completely unexpected.

The acrylamide polydimethylsiloxane, (A), of the preferred conformal coating compositions contains at least 20 siloxane units and less than 300 siloxane units. These acrylamide polydimethylsiloxanes contain siloxane units having two acrylamide functional groups on the terminal units where the acrylamide groups are bonded to silicon atoms through Si—C bonds. Polydimethylsiloxanes endblocked with

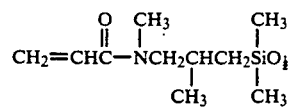

are preferred when there are from 20 to 125 siloxane units per molecule. The most preferred acrylamide polydimethylsiloxanes of (A) are those which have from 70 to 110 siloxane units per molecule. The preferred amount of (A) in these compositions is from 25 to 40 weight percent based on the total weight of the composition.

The polydiorganosiloxane, (B), of the conformal coating compositions preferably contain on the average from 10 to 60 siloxane units per molecule. The most preferred compositions contain polydiorganosiloxane (B) in which there are from 40 to 60 siloxane units per molecule. The polydiorganosiloxanes can be single polymers which provide the required average number of siloxane units per molecule or they can be mixtures of polymers which provide the required average number of siloxane units per molecule. The preferred compositions contain from 20 to 30 weight percent polydiorganosiloxane (B) based on the total weight of the composition.

The conformal coating compositions contain reactive diluent, (F), to reduce the viscosity of the composition and to provide tougher cured films and coatings. The reactive diluent, (F), must be compatible with the rest of the ingredients of the composition and react during the curing processes so that they become part of the cured product. Reactive diluents include isobornyl acrylate, cyclohexyl acrylate, and 2-ethylhexyl acrylate. Reactive diluent (F) is preferably isobornyl acrylate. The preferred conformal coating composition contains isobornyl acrylate in an amount of from 25 to 45 weight percent based on the total weight of the composition.

The photoinitiator, (C), in the conformal coating composition is a combination of two photoinitiators which is present in an amount of from 0.5 to 10 weight percent based on the total weight of the composition in which there is at least 0.25 weight percent of

and at least 0.25 weight percent of

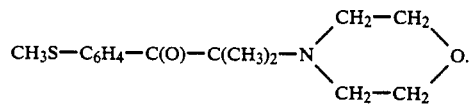

Photoinitiator combination (C) is preferably present in an amount of from 1 to 5 weight percent in which 2-hydroxy-2-methylphenylpropanone provides an amount of from 1.5 to 3 weight percent and 2-methyl-1-[4-(methylthio)phenyl]-2-morpholenopropanone provides an amount of from 1.5 to 3 weight percent. It was quite unexpected that a combination of photoinitiators together with an amine and organic titanate would provide a fast UV curing composition which also moisture cured and heat cured. Although some other photoinitiator combinations improved the rate of UV cure, the overall properties of the compositions of the present invention were superior as a conformal coating for printed wire boards.

The conformal coating compositions contain an amine, (G), dimethylethanolamine or diisopropylethylamine, present in an amount of from 0.1 to 2 weight percent, preferably from 0.5 to 1.5 weight percent, wherein the weight percentages are based on the total weight of the composition. These amines reduce the surface tackiness. The preferred amine is dimethylethanolamine.

These conformal coating compositions can also contain a photosensitizer which can influence the ultraviolet radiation curing by improving the rate of cure and uniformity of the cure. These photosensitizers include dyes, for example, 4-methyl-7-(N,N-diethylamino)-coumarin. These photosensitizers are preferably present in small amounts such as less than 0.5 weight percent based on the total weight of the composition.

Adhesion additive can also be present in the conformal coating compositions. One adhesion additive which has been found to be useful is a mixture of hexamethoxysilethylene and pentaerythritol, which is particularly useful in the weight ratio of 40 to 60 weight percent of the hexamethoxysilethylene and 40 to 60 weight percent of the pentaerthritol based on the weight of the adhesion additive. The hexamethoxysilethylene has a formula

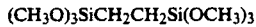

(CH₃O)₃SiCH₂CH₂Si(OCH₃)₃

These adhesion additives ensure the adhesion of the conformal coating to the printed circuit boards.

These preferred conformal coating compositions of the present invention can also contain certain other additives which are not detrimental to the curing characteristics, the storage stability, the cured film, and the usefulness of the cured film. Such additives include antioxidants and storage stabilizers.

Substrates which are populated with devices having geometries such that coating them produces areas where the composition would be in the shadows when the ultraviolet radiation is directed at the surface. Such populated devices can be coated with the compositions of this invention and can be cured in areas where the ultraviolet radiation strikes, as well as, in the shadow area. The composition in the shadow areas will cure by merely being exposed to atmospheric moisture or with heating when it is desired to shorten the time period for curing the shadowed areas. Such substrates include populated printed circuit boards or printed wire boards.

The preferred conformal coating compositions cure by exposure to a dose of ultraviolet radiation in the amount of as little as 200 millijoules per square centimeter (in air) and still moisture cure in the shadow areas or dark areas, i.e. where the composition is not exposed to the ultraviolet radiation. The compositions are exposed to ultraviolet radiation to cure in air, because they cure so fast under an inert atmosphere, such as nitrogen, that the surface cures before the material below the surface even though it may only be one to three mils in thickness. The fast UV cure under an nitrogen atmosphere might be used in applications where the coatings are very thin, basically a surface cure.

The source of the ultraviolet radiation is not critical as long as cure can be obtained. It is preferred to use a broad spectrum wavelength ultraviolet source for radiating the composition to provide cure. Many sources are available commercially.

The following examples are illustrative of the invention which is properly delineated in the claims. In the following examples part or parts represent parts by weight and the viscosity measurements are at 25° C. unless otherwise stated. The compositions in the following examples were cured in an air atmosphere using an LCU (laboratory curing unit) from UVEXS, Inc, Mountain View, Calif., which had a stainless steel belt on which the samples were placed for curing, and which had belt speeds of 3 feet per minute to 14 feet per minute. This LCU had a medium pressure mercury vapor six inch lamp with a power of 200 watts per inch. The dosage was controlled by the belt speed and the number of passes through the LCU. The dosages were measured by using an international compact radiometer.

EXAMPLE 1

A composition was prepared by blending together 36 parts of an acrylamide polydimethylsiloxane (Polymer A) of the average formula

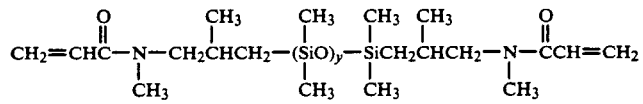

in which y had an average value of about 90, 24.6 parts of a methacrylate polydimethylsiloxane (Polymer B) having the following average formula

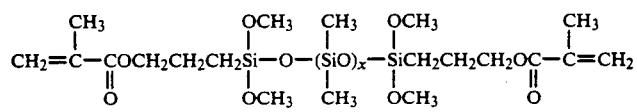

where the polydiorganosiloxane was 19.4 parts wherein x had an average value of 30 and 5.2 parts wherein x had an average value of 300, 31 parts of isobornyl acrylate, 0.3 part of tetrabutyl titanate, a photoinitiator combination of 1.75 parts of 2-hydroxy-2-methylphenyl propanone and 2.33 parts of 2-methyl-1-[4-(methylthio)-phenyl]-2-morpholenopropanone, 0.72 part of dimethylethanolamine, 0.01 part of 4-methyl-7-(N,N-diethylamino)-coumarin, 2.9 parts of 1,1-bis-tertiary-butyl-peroxy cyclohexane, and 0.4 part of an adhesion additive which was a blend of 45 weight percent of hexaethoxysilethylene and 55 weight percent of pentaerythritol, and less than 500 ppm of para-methoxyphenol and phenothiazine as stabilizers. The resulting mixture has a viscosity of 0.12 Pa.s and had a shelf life of greater than three months stored in a sealed container in the dark. When the composition was coated and cured by exposure to UV radiation at a dosage of 1500 mJ/cm², the composition cured where the UV radiation struck the surface of the composition. The composition cured to an excellent conformal coating without forming a wrinkled surface. It adhered to the coupon surface and when used on a populated board it cured by the UV exposure, and by heating or by moisture cure in the dark or shadowed areas.

For comparative purposes, a composition was prepared as described above except 1,1-bis-tertiary-butyl-peroxy cyclohexane was left out (Comparative Example).

The viscosity of the above compositions were measured after exposure to air for the times shown in Table 1. This provided the pot life or tank life of the compositions.

TABLE 1

| DAYS EXPOSURE TO AIR | VISCOSITY AT 25° C., cps | |
|---|---|---|
| | COMPARATIVE EXAMPLE | THIS INVENTION |
| INITIAL | 120 | 120 |
| 1 | 140 | 130 |
| 2 | 155 | 142 |
| 3 | 165 | 150 |
| 4 | 180 | 160 |
| 5 | 206 | 166 |
| 6 | 220 | 176 |
| 7 | 240 | 184 |
| 8 | 255 | 190 |
| 9 | 270 | 192 |

The samples of compositions exposed to air as shown above after 3, 5, 6, 7, and 8 days were placed in closed containers, stored at room temperature, and the viscosities were then measured as the time intervals as described in Table 2. The samples are designated according to the length of time exposed to air, to illustrate sample 3 is the composition after 3 days exposure to air. These viscosity measurements show that the shelf life of the compositions of this invention are substantially improved even after exposure to moisture.

TABLE 2

| TIME INTERVAL | SAMPLE | | | | |
|---|---|---|---|---|---|
| | 3 | 5 | 6 | 7 | 8 |
| COMPARATIVE EXAMPLE (NO PEROXIDE) | | | | | |
| INITIAL* | 165 | 206 | 220 | 240 | 255 |
| 2 Weeks | 197 | 390 | 370 | 400 | 411 |
| 4 Weeks | 205 | 508 | 456 | 655 | 543 |
| 8 Weeks | 205 | 764 | 632 | 1172 | 935 |
| 10 Weeks | 200 | GEL | 860 | GEL | GEL |
| 14 Weeks | 202 | — | GEL | — | — |
| THIS INVENTION | | | | | |
| INITIAL* | 150 | 166 | 176 | 184 | 190 |
| 2 Weeks | 159 | 183 | 199 | 207 | 220 |
| 4 Weeks | 163 | 197 | 233 | 231 | 243 |
| 8 Weeks | 163 | 200 | 230 | 264 | 257 |
| 10 Weeks | 165 | 209 | 243 | 276 | 280 |
| 14 Weeks | 163 | 208 | 241 | 276 | 277 |

*INITIAL means the viscosity after the air exposure as shown in Table 1.

The odor of the cured composition was observed at room temperature and at 85° C. for the Comparative Example composition, with compositions of the present invention as described in above except that the amount of 1,1-bis-tertiary-butylperoxy cyclohexane was 1 part, 2 parts, and 2.5 parts. The odors observed are shown in Table 3.

TABLE 3

| COMPOSITION | ROOM TEMPERATURE | AT 85° C. |
|---|---|---|
| COMPARATIVE EXAMPLE | STRONG ODOR | STRONG ODOR |
| 1 PART PEROXIDE | MILD ODOR | STRONG ODOR |
| 2 PARTS PEROXIDE | MILD ODOR | MILD ODOR |
| 2.5 PARTS PEROXIDE | VERY SLIGHT ODOR | VERY SLIGHT ODOR |

That which is claimed is:

1. In an ultraviolet radiation curable composition comprising a mixture of (A) an acrylamide functional polydiorganosiloxane present in an amount of at least 10 weight percent and is an acrylamide polyorganosiloxane having at least two organic groups which have acrylamide group functionality bonded to silicon atoms through Si—C bonds and on the average at least 20 but less than 1500 siloxane units per molecule, the organic groups bonded to the silicon atoms other than those having the acrylamide group functional are selected from the group consisting of methyl and phenyl; (B) a methacryloxyalkyl functional and alkoxy functional polydiorganosiloxane present in an amount of at least 20 weight percent and is a polydiorganosiloxane having endgroups where there are two alkoxy groups per endgroup bonded to silicone through an Si—O bond and one methacrylate group bonded to silicon atoms through Si—C bonds and having on the average less than 350 diorganosiloxane units per molecule, said diorganosiloxane units being selected from dimethylsiloxane units, diphenylsiloxane units, and methylphenylsiloxane units wherein at least 50 percent of the organic groups of the diorganosiloxane are methyl; (C) a photoinitiator, and (D) an organic titanate, the improvement comprising increasing the storage stability by the addition of (E) 1,1-bis-tertiary-butylperoxy cyclohexane in a sufficient quantity to also provide cure activated by heat in areas shadowed from ultraviolet radiation.

2. The ultraviolet radiation curable composition according to claim 1 in which the photoinitiator, (C), is present in an amount of from 0.5 to 10 weight percent and is compatible with (A) and (B); the organic titanate, (D), is present in a catalytic quantity of an organic titanate sufficient to cause a curing reaction when exposed to moisture after the composition is exposed to ultraviolet radiation; and 1,1-bis-tertiary-butylperoxy cyclohexane, (E), is present in an amount from 0.5 to 5 weight percent and is stable under storage conditions for the composition and does not react with the other ingredients to destroy their function.

3. The composition according to claim 2 in which the organic groups other than those having the acrylamide functionality in (A) are methyl, and the diorganosiloxane units of (B) are dimethylsiloxane units.

4. The composition according to claim 2 further comprising a reactive diluent.

5. The composition according to claim 4 in which the reactive diluent is selected from the group consisting of isobornyl acrylate, cyclohexyl acrylate, 2-ethylhexyl acrylate, multifunctional acrylates, and mixtures thereof.

6. The composition according to claim 3 further comprising a reactive diluent.

7. The composition according to claim 5 in which the composition has a viscosity at 25° C. in the range of 0.07 to 0.2 Pa.s.

8. The ultraviolet radiation curable composition according to claim 2 in which the acrylamide polyorganosiloxane, (A), is present in an amount of at least 20 weight percent based on the total weight of the composition and is an acrylamide polydimethylsiloxane having acrylamide end groups bonded to silicon atoms through Si—C bonds and on the average at least 20 to less than 300 dimethylsiloxane units per molecule; the photoinitiator, (C), is present in an amount of from 0.5 to 10 weight percent based on the total weight of the composition and is a combination in which there is at least 0.25 weight percent of based on the total weight of the composition $$C_6H_5—C(O)C(CH_3)_2—OH$$

and at least 0.25 weight percent of based on the total weight of the composition

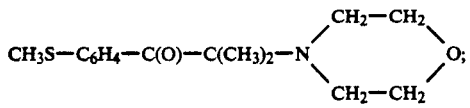

and the organic titanate, (D), is present in an amount of from 0.05 to 1 weight percent based on the total weight of the composition;

where the composition further comprises a reactive diluent, (F), selected from the group consisting of isobornyl acrylate, cyclohexyl acrylate, and 2-ethylhexyl acrylate, and is present in an amount of at least 20 weight percent based on the total weight of the composition; and an amine, (G), selected from the group consisting of dimethylethanolamine and diisopropylethylamine and is present in an amount of from 0.1 to 2 weight percent based on the total weight of the composition where the composition has a viscosity at 25 degrees C in the range of 0.07 to 0.2 Pa.s.

9. The composition according to claim 8 in which the polydimethylsiloxane of (A) has on the average from 20 to 125 dimethylsiloxane units per molecule, the polydiorganosiloxane of (B) is a polydimethylsiloxane having on the average from 10 to 60 dimethylsiloxane units per molecule, and the reactive diluent of (F) is isobornyl acrylate.

10. The composition according to claim 8 further comprising a photosensitizer.

11. The composition according to claim 8 further comprising an adhesion additive.

12. The composition according to claim 10 in which the photosensitizer is 4-methyl-7-(N,N-diethylamino)-coumarin.

13. The composition according to claim 11 in which the adhesion additive is a mixture of hexamethoxysilethylene and pentaerythritol triacrylate.

14. The composition according to claim 10 in which the photosensitizer is present in an amount of less than 0.5 weight percent based on the total weight of the composition.

15. The composition according to claim 12 in which 4-methyl-7-(N,N-diethylamino)-coumarin is present in an amount of less than 0.5 weight percent based on the total weight of the composition.

16. The composition according to claim 11 in which the adhesion additive is present in an amount of less than one weight percent based on the total weight of the composition.

17. The composition according to claim 13 in which the adhesion additive mixture is present in an amount of less than one weight percent based on the total weight of the composition and the mixture contains from 40 to 60 weight percent based on the weight of the mixture of hexamethoxysilethylene and from 40 to 60 weight percent based on the weight of the mixture of pentaerythritol triacrylate.

18. The composition according to claim 9 in which there are from 70 to 110 dimethylsiloxane units per molecule in (A), there is from 40 to 60 dimethylsiloxane units per molecule in (B), the amount of (A) is from 25 to 40 weight percent based on the weight of the total composition, the amount of (B) is from 20 to 30 weight percent based on the total weight of the composition, and the amount of isobornyl acrylate is from 25 to 45 weight percent based on the total weight of the composition.

19. The composition according to claim 18 in which the polydimethylsiloxane of (A) has the following formula

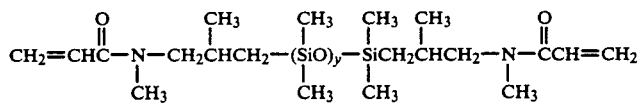

wherein y has a value of from 70 to 110, and the polydiorganosiloxane of (B) has the following formula

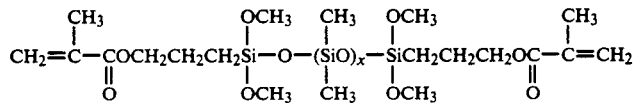

wherein x has a value of from 40 to 60.

20. The composition according to claim 19 further comprising a photosensitizer and an adhesion additive.

21. The composition according to claim 20 in which the photosensitizer is 4-methyl-7-(N,N-diethylamino)-coumarin and the adhesion additive is a mixture of hexamethoxysilethylene and pentaerythritol.

22. The composition according to claim 21 in which 4-methyl-7-(N,N-diethylamino)-coumarin is present in an amount of less than 0.5 weight percent based on the total weight of the composition and the mixture is present in amount of less than one weight percent based on the total weight of the composition and the mixture contains from 40 to 60 weight percent based on the weight of the mixture of the hexamethoxysilethylene and from 40 to 60 weight percent based on the weight of the mixture of the pentaerythritol triacrylate.

23. The composition according to claim 22 further comprising an antioxidant.

24. The composition according to claim 8 in which the amine, (G), is dimethylethanolamine.

25. The composition according to claim 9 in which the amine, (G), is dimethylethanolamine.

26. The composition according to claim 11 in which the amine, (G), is dimethylethanolamine.

27. The composition according to claim 13 in which the amine, (G), is dimethylethanolamine.

28. The composition according to claim 16 in which the amine, (G), is dimethylethanolamine.

29. The composition according to claim 17 in which the amine, (G), is dimethylethanolamine.

30. The composition according to claim 18 in which the amine, (G), is dimethylethanolamine.

31. The composition according to claim 19 in which the amine, (G), is dimethylethanolamine.

32. The composition according to claim 20 in which the amine, (G), is dimethylethanolamine.

* * * * *